(12) United States Patent
Bolcavage et al.

(10) Patent No.: US 9,719,353 B2
(45) Date of Patent: Aug. 1, 2017

(54) INTERFACIAL DIFFUSION BARRIER LAYER INCLUDING IRIDIUM ON A METALLIC SUBSTRATE

(75) Inventors: Ann Bolcavage, Indianapolis, IN (US); Randolph C. Helmink, Avon, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 74 days.

(21) Appl. No.: 14/111,417

(22) PCT Filed: Apr. 13, 2012

(86) PCT No.: PCT/US2012/033538
§ 371 (c)(1),
(2), (4) Date: Dec. 18, 2013

(87) PCT Pub. No.: WO2012/142422
PCT Pub. Date: Oct. 18, 2012

(65) Prior Publication Data
US 2014/0134455 A1 May 15, 2014

Related U.S. Application Data

(60) Provisional application No. 61/474,980, filed on Apr. 13, 2011.

(51) Int. Cl.
*C25D 11/02* (2006.01)
*F01D 5/02* (2006.01)
(Continued)

(52) U.S. Cl.
CPC ............ *F01D 5/028* (2013.01); *C23C 14/025* (2013.01); *C23C 14/16* (2013.01); *C23C 14/5853* (2013.01); *C23C 28/021* (2013.01); *C23C 28/023* (2013.01); *C23C 28/321* (2013.01); *C23C 28/322* (2013.01); *C23C 28/345* (2013.01); *C23C 28/3455* (2013.01);
(Continued)

(58) Field of Classification Search
None
See application file for complete search history.

(56) References Cited

U.S. PATENT DOCUMENTS 3,770,487 A 11/1973 Gibson et al.
4,477,538 A * 10/1984 Clarke ................. C23C 28/023
428/656

(Continued)

FOREIGN PATENT DOCUMENTS

EP 1347079 A2 9/2003
EP 1666629 A2 6/2006
(Continued)

OTHER PUBLICATIONS

English Translation of the Office Action from counterpart Russian Application No. 2013150514/02(078670), dated Mar. 11, 2015, 3 pp.
(Continued)

*Primary Examiner* — Daniel J Schleis
(74) *Attorney, Agent, or Firm* — Shumaker & Sieffert. P.A.

(57) ABSTRACT

An article may include a substrate, a diffusion barrier layer formed on the substrate, and a protective layer formed on the diffusion barrier coating. The diffusion barrier layer may include iridium.

19 Claims, 2 Drawing Sheets

(51) Int. Cl.
*C23C 28/02* (2006.01)
*C23C 14/02* (2006.01)
*C23C 14/16* (2006.01)
*C23C 14/58* (2006.01)
*C23C 28/00* (2006.01)

(52) U.S. Cl.
CPC ......... *C23C 28/36* (2013.01); *Y10T 428/1259* (2015.01); *Y10T 428/1275* (2015.01); *Y10T 428/12847* (2015.01); *Y10T 428/12875* (2015.01)

(56) References Cited

U.S. PATENT DOCUMENTS

| | | | |
|---|---|---|---|
| 4,574,015 A * | 3/1986 | Genereux | C22F 1/10 148/409 |
| 5,059,095 A | 10/1991 | Kushner et al. | |
| RE34,173 E | 2/1993 | Kerber | |
| 5,499,905 A | 3/1996 | Schmitz et al. | |
| 6,207,297 B1 | 3/2001 | Sabol et al. | |
| 6,306,524 B1 | 10/2001 | Spitsberg et al. | |
| 6,333,118 B1 | 12/2001 | Alperine et al. | |
| 6,455,173 B1 | 9/2002 | Marijnissen et al. | |
| 6,532,657 B1 | 3/2003 | Weimer et al. | |
| 6,558,813 B2 | 5/2003 | Darolia | |
| 6,616,410 B2 | 9/2003 | Grylls et al. | |
| 6,620,525 B1 | 9/2003 | Rigney et al. | |
| 6,630,250 B1 | 10/2003 | Darolia | |
| 6,720,088 B2 | 4/2004 | Zhao et al. | |
| 6,733,908 B1 | 5/2004 | Lee et al. | |
| 6,746,728 B1 | 6/2004 | Kusumoto et al. | |
| 6,861,157 B2 | 3/2005 | Zhao et al. | |
| 6,921,251 B2 | 7/2005 | Ackerman et al. | |
| 6,926,928 B2 | 8/2005 | Ackerman et al. | |
| 6,933,052 B2 | 8/2005 | Gorman et al. | |
| 6,974,636 B2 | 12/2005 | Darolia et al. | |
| 6,982,126 B2 | 1/2006 | Darolia et al. | |
| 7,205,053 B2 | 4/2007 | Narita et al. | |
| 7,258,934 B2 | 8/2007 | Wigren et al. | |
| 7,288,328 B2 | 10/2007 | Darolia et al. | |
| 7,374,821 B2 | 5/2008 | Leclercq et al. | |
| 7,378,159 B2 | 5/2008 | Gorman et al. | |
| 7,396,592 B2 | 7/2008 | Saint-Ramond et al. | |
| 7,416,790 B2 | 8/2008 | Jiang et al. | |
| 7,544,424 B2 * | 6/2009 | Gorman | C23C 10/02 416/241 R |
| 7,666,515 B2 | 2/2010 | Nagaraj et al. | |
| 7,695,830 B2 | 4/2010 | Strangman et al. | |
| 7,709,058 B2 | 5/2010 | Kunz et al. | |
| 7,749,570 B2 * | 7/2010 | Rucker | C23C 4/02 427/383.1 |
| 7,766,617 B1 | 8/2010 | Liang | |
| 8,047,775 B2 | 11/2011 | Barnikel et al. | |
| 8,187,717 B1 | 5/2012 | Xie et al. | |
| 8,696,304 B2 | 4/2014 | Elliott et al. | |
| 2003/0186075 A1 | 10/2003 | Zhao et al. | |
| 2003/0208904 A1 | 11/2003 | Tefft | |
| 2006/0121304 A1 | 6/2006 | Gorman et al. | |
| 2008/0069959 A1 | 3/2008 | Leclercq et al. | |
| 2008/0138647 A1 | 6/2008 | Jiang et al. | |
| 2008/0193657 A1 | 8/2008 | Raybould et al. | |
| 2009/0061086 A1 | 3/2009 | Jiang et al. | |
| 2009/0269207 A1 | 10/2009 | Eichmann et al. | |
| 2009/0317658 A1 | 12/2009 | Narita | |
| 2010/0178169 A1 | 7/2010 | Webb | |
| 2010/0239429 A1 | 9/2010 | Eichmann et al. | |
| 2010/0252151 A1 | 10/2010 | Furrer et al. | |
| 2011/0299996 A1 | 12/2011 | Uihlein et al. | |

FOREIGN PATENT DOCUMENTS

| | | |
|---|---|---|
| EP | 1806433 A2 | 7/2007 |
| GB | 2444611 A | 6/2008 |
| JP | H03120327 A | 5/1991 |
| JP | 2001323332 A | 11/2001 |
| JP | 2002302779 A | 10/2002 |
| JP | 2003277860 A | 10/2003 |
| JP | 2003277953 A | 10/2003 |
| JP | 2004518820 A | 6/2004 |
| JP | 2006057182 A | 3/2006 |
| JP | 2006161808 A | 6/2006 |
| JP | 2008144275 A | 6/2008 |
| RU | 2405064 C2 | 3/2009 |
| RU | 2365565 C2 | 8/2009 |
| RU | 2370471 C2 | 10/2009 |
| UA | 35621 C2 | 4/2001 |
| UA | 46761 C2 | 6/2002 |
| UA | 48169 C2 | 9/2002 |
| WO | 9631636 A1 | 10/1996 |
| WO | 9634130 A1 | 10/1996 |
| WO | WO2012142422 A1 | 10/2012 |

OTHER PUBLICATIONS

Polyak M.S., "Technology of Hardening," (Tekhnologiya uprochneniya) Moscow, Mashinostroenie, L.V.M. Script, vol. 1, 1995, 7 pp. (Applicant points out that, in accordance with MPEP 609.04(a), the 1995 year of publication is sufficiently earlier than the effective U.S. filed and any foreign priority date of Mar. 12, 2014 so that the particular month of publication is not in issue.)

Decision on Grant from counterpart Russian Application No. 2013150514, dated Jun. 16, 15 pp.

Office Action and English Translation from counterpart Ukrainian Application No. 201313180, dated Dec. 23, 2014, 12 pp.

Official Action and English translation of Notice of Reasons for Rejection from counterpart Japanese Patent Application No. 2014-505340, mailed Aug. 26, 2014, 12 pp.

Fisher et al., "An assessment of the oxidation resistance of an iridium and an iridium/platinum low activity aluminide/MarM002 system at 1100 C" Surface and Coatings Technology 113, Mar. 1999, pp. 259-267.

International Preliminary Report on Patentability from international counterpart application No. PCT/US2012/033538, mailed Oct. 24, 2013, 7 pp.

International Search Report and Written Opinion for counterpart International application No. PCT/US2012/033538, mailed May 23, 2012, 12 pp.

Decision on Grant, and translation thereof, from counterpart Ukraine Application No. a 2013 13180, dated Sep. 23, 2015, 15 pp.

* cited by examiner

INTERFACIAL DIFFUSION BARRIER LAYER INCLUDING IRIDIUM ON A METALLIC SUBSTRATE

CROSS REFERENCE TO RELATED APPLICATIONS

This application is a national stage entry under 35 U.S.C. §371 of PCT Application No. PCT/US2012/033538, filed Apr. 13, 2012, which claims the benefit of U.S. Provisional Application No. 61/474,980, filed Apr. 13, 2011. The entire contents of PCT Application No. PCT/US2012/033538 and U.S. Provisional Application No. 61/474,980 are incorporated herein by reference.

TECHNICAL FIELD

The disclosure relates to coatings for superalloy substrates.

BACKGROUND

Gas turbine engines include compressor blades that rotate to compress inlet gases and turbine blades that rotate to harness energy from expansion of outlet gases. Gas turbine blades are attached to gas turbine disks. The gas turbine disks rotate with the gas turbine blades and may experience peak stresses in excess of about 1000 megapascals (MPa) due to centrifugal loading from the gas turbine blades and weight of the gas turbine disks themselves.

In some examples, gas turbine disks may not be directly exposed to the flow path of hot gases in the gas turbine engine. Thus, in some implementations, maximum surface temperatures of the gas turbine disks may be about 650° C. The thermal and mechanical stresses to which the gas turbine disks are exposed impose design criteria which the alloys that form the gas turbine disks may satisfy. These design criteria include relatively high yield strength and tensile strength to inhibit yield and fracture of the gas turbine disk, relatively high ductility and fracture toughness to impart tolerance to defects, relatively high resistance to initiation of fatigue cracks, and relatively low fatigue crack propagation rates. In some implementations, gas turbine disks may be formed from nickel (Ni)-based superalloys, which may satisfy at least some of these design criteria.

In some examples, compressor blades may be an integral part of the gas turbine disk. In such cases, separately bladed and integrally bladed gas turbine disks may experience similar operating temperatures and thermal and mechanical stresses, and, thus, may have similar material design criteria.

As operating temperatures of gas turbine engines increase in search of greater operating efficiency, surface temperatures of the gas turbine disk may increase. As maximum surface temperatures of the gas turbine disk increase above 700° C., oxidation and/or hot-corrosion of the surface of the gas turbine disk may become more likely. Oxidation or hot corrosion may change the chemical composition, phase constitution, and/or resulting microstructure of the surface region of the gas turbine disk. This may affect the resulting mechanical properties of the gas turbine disk, as the mechanical properties may be affected by the chemical composition, phase constitution, and microstructure of the alloy. Thus, is some examples, a gas turbine disk includes a coating that provides oxidation- and/or hot-corrosion-resistance to the surface of the gas turbine disk.

SUMMARY

The disclosure describes an article that includes a substrate, a diffusion barrier layer formed on the substrate, and a protective layer formed on the diffusion barrier layer and techniques for forming such an article. The diffusion barrier layer may reduce diffusion of elements between the protective layer and the substrate and/or between the substrate and the protective layer. In some examples, this may help maintain the chemical composition, phase constitution and/or microstructure of the protective layer and/or the substrate, which may help maintain the properties of the protective layer and/or the substrate.

The diffusion barrier layer may include iridium (Ir). In some examples, the diffusion barrier layer, as deposited, consists essentially of Ir. In some examples, the diffusion barrier layer, as deposited, may additionally include at least one of silicon (Si), chromium (Cr), platinum (Pt), palladium (Pd), rhenium (Re), ruthenium (Ru), or rhodium (Rh).

In one aspect, the disclosure is directed to an article that includes a substrate, a diffusion barrier layer formed on the substrate, and a protective layer formed on the diffusion barrier layer. In accordance with the aspect of the disclosure, the diffusion barrier layer includes iridium.

In another aspect, the disclosure is directed to a method that includes forming a diffusion barrier layer on a substrate and forming a protective layer on the diffusion barrier layer. In accordance with the aspect of the disclosure, the diffusion barrier layer includes iridium.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
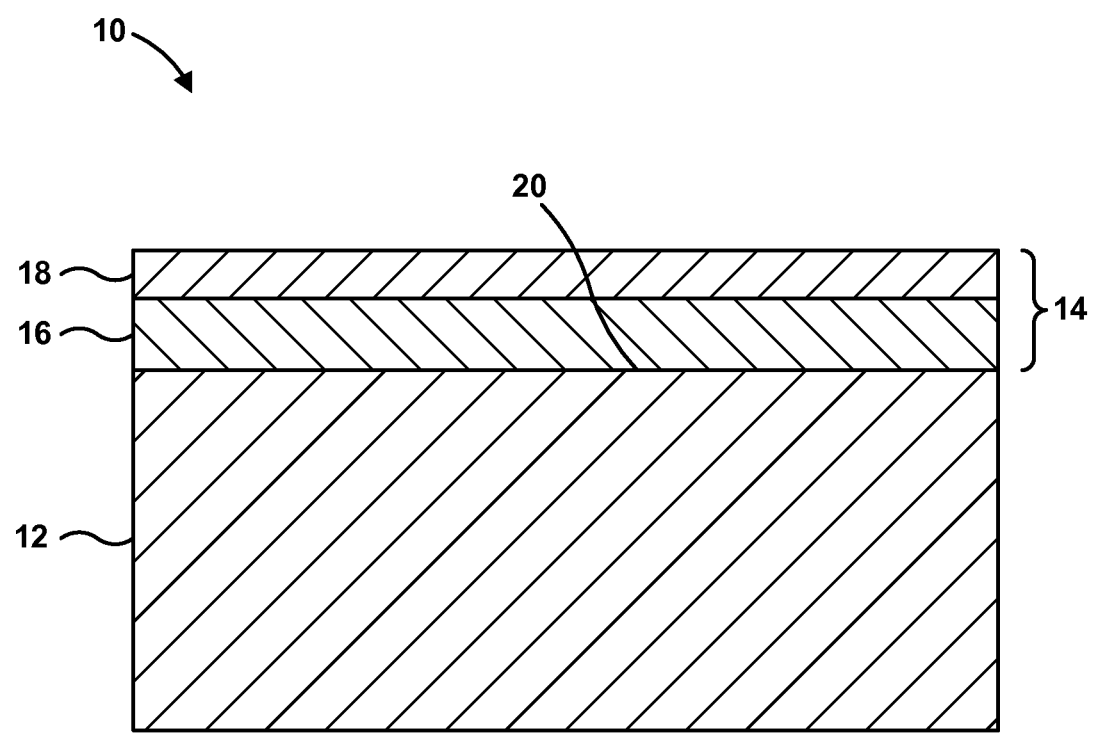
FIG. 1 is a conceptual diagram illustrating a cross-sectional view of an example article that includes a substrate, a diffusion barrier layer, and a protective layer.

As described above, a gas turbine disk may include a substrate and a protective layer on a surface of the substrate, which may provide oxidation and/or hot-corrosion resistance to the surface of the substrate. However, in some examples, interdiffusion of an element or elements between the substrate and the protective layer may deleteriously affect properties of the substrate and/or the protective layer. For example, the substrate may include a Ni-based superalloy that includes additional elements such as titanium (Ti), cobalt (Co), or aluminum (Al), which beneficially affect the properties of the substrate. However, diffusion of Ti or Co from the substrate into the protective layer may adversely affect the oxidation or corrosion protection afforded to the substrate by the protective layer. As another example, diffusion of Al from the substrate to the protective layer may lower Al content in at least a portion of the substrate, which may result in a reduced gamma prime ($\gamma'$) phase volume fraction in the portion of the substrate. A reduced γ' phase volume fraction may adversely impact mechanical properties of the substrate.

Conversely, diffusion of elements from the protective layer to the substrate may reduce effectiveness of the protective layer. For example, the protective layer may include Cr, Al, or hafnium (Hf), which may react with oxygen to form substantially inert oxides that form an adherent oxide scale (or oxide layer) on the protective layer and reduce or substantially prevent oxidation of underlying layers (e.g., the substrate). Diffusion of elements such as Al, Cr, or Hf from the protective layer may reduce the amount of those elements present in the protective layer and available to react with oxygen to form the oxide scale.

Additionally, in some examples, diffusion of elements from the substrate to the protective layer or from the protective layer to the substrate may result in formation of additional phases or layers during prolonged exposure to high temperatures, such as thousands of hours around 700° C., hundreds of hours around 750° C., or tens of hours around 800° C. For example, a brittle and/or non-strain compliant phase may form in the protective layer during exposure to high temperatures, which may adversely impact performance of the protective layer. One example of a brittle and/or non-strain compliant phase includes a topologically close-packed phase that may form from chromium and a refractory element, such as molybdenum (Mo) or tungsten (W).

In accordance with aspects of the present disclosure, an article may include a diffusion barrier layer between the substrate and the protective layer. The diffusion barrier layer may reduce or substantially prevent diffusion between the substrate and the protective layer and/or between the protective layer and the substrate. In some examples, this may reduce or substantially eliminate one or more of the deleterious effects due to diffusion that were discussed above. As described above, the diffusion barrier layer includes Ir or an Ir alloy.

FIG. 1 is a conceptual diagram illustrating a cross-sectional view of an example article 10 that includes a substrate 12 coated with a coating 14. In the example illustrated in FIG. 1, coating 14 includes a diffusion barrier layer 16 formed on substrate 12 and a protective layer 18 formed on diffusion barrier layer 16.

Substrate 12 may include a superalloy, such as a Ni-based or Co-based superalloy. In some examples, substrate 12 includes a Ni-based superalloy suitable for use in a gas turbine disk or gas turbine spacer. As described above, the superalloy from which a gas turbine disk is formed may satisfy certain design criteria, including, for example, relatively high yield strength and tensile strength to inhibit yield and fracture of the gas turbine disk, relatively high ductility and fracture toughness to impart tolerance to defects, relatively high resistance to initiation of fatigue cracks, and relatively low fatigue crack propagation rates.

Properties of the superalloy from which substrate 12 is formed may be a function of the composition of the superalloy and the phase constitution and microstructure of the superalloy. The microstructure of the superalloy may include the grain size of the superalloy and a precipitate phase composition, size, and volume fraction. In some examples, the phase constitution and microstructure of the superalloy may be affected by mechanical and thermal processing of the superalloy. For example, thermal processing, e.g., heat treatment, of the superalloy may affect grain structure of the superalloy, precipitate phase size and/or composition, or the like.

In some examples, substrate 12 includes a polycrystalline Ni-based superalloy, which includes a plurality of grains. Substrate may include at least one of Al, Ti, and Ta in addition to Ni. In some examples, a concentration of elements, such as between about 2 weight percent (wt. %) and about 5 wt. % Al, between about 2 wt. % and about 5 wt. % Ti, and less than about 3 wt. % tantalum (Ta), in substrate 12 may be sufficient to result in gamma-prime (γ') precipitate formation in substrate 12. For example, the concentration of Al, Ti, and/or Ta in substrate 12 may result in a γ' precipitate phase volume fraction between about 40 volume percent (vol. %) and about 55 vol. %. In some instances, higher or lower elemental contents of the individual gamma prime forming elements can be employed while maintaining the overall gamma prime phase fraction at desired levels for properties such as strength and ductility. The volume fraction, size, and distribution of the γ' precipitate phase may be influenced by the alloy composition, heat treatment temperature, heat treatment duration, and cooling rate during heat treatment. Additionally, substrate 12 may include grain sizes between about 5 micrometers (μm) in diameter to between about 30 μm and about 50 μm or more in diameter, engineered for a combination of yield strength, resistance to fatigue crack initiation, creep strength, and resistance to fatigue crack growth. In some examples, substrate 12 may include additional elements that segregate to grain boundaries of substrate 12. The segregating elements may affect creep resistance and low-cycle fatigue resistance of substrate 12. Examples of segregating elements include boron (B; up to about 0.03 weight percent (wt. %) of substrate 12), carbon (C; up to about 0.05 wt. % of substrate 12), and zirconium (Zr; up to about 0.1 wt. % of substrate 12). Examples of compositions and heat treatment techniques that may result in suitable Ni-based disk alloys are described in U.S. patent application Ser. No. 12/755,170, entitled "TECHNIQUES FOR CONTROLLING PRECIPITATE PHASE DOMAIN SIZE IN AN ALLOY," and filed Apr. 6, 2010, the entire content of which is incorporated herein by reference.

In an example, substrate 12 may include a Ni-based superalloy with a composition of about 15 wt. % Cr, about 18.5 wt. % Co, about 5 wt. % Mo, about 3 wt. % Al, about 3.6 wt. % Ti, about 2 wt. % Ta, about 0.5 wt. % Hf, about 0.06 wt. % Zr, about 0.027 wt. % C, about 0.015 wt. % B, and a balance Ni (about 52.3 wt. % Ni).

Coating 14 is formed on surface 20 of substrate 12 and includes diffusion barrier layer 16 and protective layer 18. Protective layer 18 may include an element or elements that provide to substrate 12 environmental protection against hot gases and chemical species in the gas turbine environment. For example, protective layer 18 may provide protection from oxidation and/or hot-corrosion of substrate 12. In some examples, the element or elements in protective layer 18 may form an oxide layer that adheres to protective layer 18 and/or diffusion barrier layer 16 (if, for example, protective layer 18 is exhausted by formation of the oxide layer). In some examples, the oxide layer may include alumina (aluminum oxide; $Al_2O_3$), chromia (chromium oxide; $Cr_2O_3$), or chromia and alumina. Accordingly, in some examples, protective layer 18 includes at least one of aluminum or chromium. In an example, protective layer 18 may include NiFeCrMnSi alloy with a nominal composition of about 30 wt. % Cr, 30 wt. % iron (Fe), 1 wt. % manganese (Mn), 1 wt. % silicon (Si), and a balance Ni (about 38 wt. % Ni).

Protective layer 18 may be applied using, for example, directed vapor physical-vapor deposition (DVD), electroplating, or nano-scale electroplating. Any of these techniques may facilitate deposition of single or multiple layers of material with a controlled composition and thickness. In some examples, protective layer 18 may be deposited at temperatures below a temperature of about 800° C. that could result in microstructure changes in substrate 12. This may allow protective layer 18 to be formed on diffusion barrier layer 16 substantially without affecting the physical properties of substrate 12.

Diffusion barrier layer 16 includes a composition that reduces diffusion between substrate 12 and protective layer 18 and/or between protective layer 18 and substrate 12. For example, diffusion barrier layer 16 may include Ir or an Ir alloy (and may include elements other than those listed described as being present in diffusion barrier layer 16). In some examples, when applied, diffusion barrier layer 16 may consist essentially of Ir; that is, diffusion barrier layer 16 may include Ir and elements that do not materially affect the basic and novel characteristics of diffusion barrier layer 16 when diffusion barrier layer 16 initially is formed on substrate 12. In other examples, when applied, diffusion barrier layer 16 may consist essentially of an Ir alloy; that is, diffusion barrier layer 16 may include the elements specified in the Ir alloy and elements that do not materially affect the basic and novel characteristics of diffusion barrier layer 16 when diffusion barrier layer 16 initially is formed on substrate 12. In other examples, diffusion barrier layer 16 may consist of Ir or an Ir alloy when initially formed on substrate 12.

In some examples, diffusion barrier layer 16 may include various alloys of Ir and other elements. For example, diffusion barrier layer 16 may include an alloy of Ir and Cr. As another example, diffusion barrier layer 16 may include an alloy of Ir and Si. As another example, diffusion barrier layer 16 may include an alloy of Ir and at least one additional platinum group metal, such as Pt, Pd, Re, Ru, or Rh. In some examples, diffusion barrier layer 16 may include an alloy of Ir, Cr, and Si or an alloy of Ir, Cr, Si, and at least one of Pt, Pd, Re, Ru, or Rh. As described above, when initially formed on substrate 12, diffusion barrier layer 16 may include, consist essentially of, or consist of any of the alloys described herein. In general, the composition of diffusion barrier layer 16 may be selected to be chemically stable at the interface between substrate 12 and diffusion barrier layer 16 (e.g., surface 20).

In some examples in which diffusion barrier layer 16 includes an Ir alloy, the Ir alloy may include a predominance of Ir. In other words, the Ir alloy may include more Ir than any other single element in the alloy, determined on a weight basis. In other examples, the Ir alloy may not include a predominance Ir, e.g., the alloy may include another element in an amount greater than the amount of Ir.

In some examples, the Ir alloy may include a majority Ir. A majority Ir means greater than 50 wt. % Ir. In other examples, the Ir alloy may not include a majority Ir, e.g., the alloy may include other elements in a total amount greater than the amount of Ir.

An example of a Ir composition that may be utilized in diffusion barrier layer 16 includes between about 10 wt. % and about 40 wt. % Ir, between about 26.2 wt. % and about 65 wt. % Ni, between about 15 wt. % and about 30 wt. % Fe, between about 10 wt. % and about 30 wt. % Cr, less than about 1 wt. % Mn, less than about 2 wt. % Al, and less than about 0.8 wt. % Si.

Diffusion barrier layer 16 may be formed on substrate 12 using, for example, directed vapor deposition (DVD), electroplating, or nano-scale electroplating. Any of these techniques may facilitate deposition of single or multiple layers of material with a controlled composition and thickness. In some examples, diffusion barrier layer 16 may be deposited at temperatures below a temperature that could result in microstructure changes in substrate 12. This may allow diffusion barrier layer 16 to be formed on substrate 12 substantially without affecting the physical properties of substrate 12. In some examples, diffusion barrier layer 16 and protective layer 18 may be deposited using the same technique, while in other examples, diffusion barrier layer 16 and protective layer 18 may be deposited using different techniques.

Coating 14 may have a total thickness between about 0.00025 inches (about 6.35 μm) and about 0.005 inches (about 127 μm). The total thickness of coating 14 includes the thickness of both diffusion barrier layer 16 and protective layer 18. The total thickness of coating 14 may be measured substantially normal to a surface 20 of substrate 12 on which coating 14 is formed. In some examples, coating 14 may have a total thickness between about 0.0005 inches (about 12.7 μm) and about 0.0015 inches (about 38.1 μm).

A thickness of diffusion barrier layer 16 may be between about 5% and about 50% of the total thickness of coating 14. In some examples, diffusion barrier layer 16 may have a thickness between about 10% and about 30% of the total thickness of coating 14. Example ranges of the thickness of diffusion barrier layer 16 include: between about 0.0000125 inches (about 0.3175 μm) and about 0.000125 inches (about 3.175 μm); between about 0.000025 inches (about 0.635 μm) and about 0.000075 inches (about 1.905 μm); between about 0.00025 inches (about 6.35 μm) and about 0.0025 inches (about 63.5 μm); between about 0.0005 inches (about 12.7 μm) and about 0.0015 inches (about 38.1 μm); between about 0.0000125 inches (about 0.3175 μm) and about 0.0025 inches (about 63.5 μm); and between about 0.000025 inches about 0.635 μm) and about 0.0015 inches (about 38.1 μm). Other example ranges of the thickness of diffusion barrier layer 16 include: between about 0.000025 inches (about 0.635 μm) and about 0.00025 inches (about 6.35 μm); between about 0.00005 inches (about 1.27 μm) and about 0.00015 inches (about 3.81 μm); between about 0.000075 inches (about 1.905 μm) and about 0.00075 inches (about 19.05 μm); between about 0.00015 inches (about 3.81 μm) and about 0.00045 inches (about 11.43 μm); between about 0.000025 inches (about 0.635 μm) and about 0.00075 inches (about 19.05 μm); and between about 0.00005 inches (about 1.27 μm) and about 0.00045 inches (about 11.43 μm). The ranges of thickness of coating 14 and diffusion barrier layer 16 listed herein are merely examples and other thicknesses of coating 14 and/or diffusion barrier layer 16 may be utilized and fall within the scope of this disclosure.

Although the forgoing example has been directed to an article 10 that includes a single diffusion barrier layer 16 and a single protective layer 18, in some examples, an article may include at least two diffusion barrier layers and/or at least two protective layers. In some examples, the at least two diffusion barrier layers may include different compositions and/or the at least two protective layers may include different compositions. For example, a first diffusion barrier layer, which is formed on the substrate, may include a first composition and the second diffusion barrier layer, which is formed on the first diffusion barrier layer, may include a second composition. In some examples, the first composition may be more chemically and/or mechanically compatible with the substrate than the second composition. Similarly, the second composition may be more chemically and/or mechanically compatible with the protective layer than the first composition.

In some examples, instead of or in addition to including at least two diffusion barrier layers and/or at least two protective layers, and article may include a compositional gradient layer between two adjacent layers. For example, article 10 may include a compositional gradient layer between substrate 12 and diffusion barrier layer 16 and/or between diffusion barrier layer 16 and protective layer 18. In some examples, the compositional gradient layer may be substantially continuous, such that the gradient layer has a composition similar to substrate 12 near substrate 12 and has a composition similar to diffusion barrier layer 16 near diffusion barrier layer 16, with a gradual change in composition throughout the gradient layer. In other examples, the compositional gradient layer may include multiple compositionally distinct sub-layers that gradually have different compositions. The composition of the sub-layer nearest to substrate 12 may be more similar to the composition of substrate 12, while the composition of the sub-layer nearest to diffusion barrier layer 16 may be more similar to the composition of diffusion barrier layer 16.

EXAMPLES

Comparative Example 1

A set of alloy substrates were each coated with a protective layer having a thickness of about 25 μm. DVD was used to apply a protective layer that was dense and substantially uniform in microstructure. The DVD process utilized a 70 kV and 10 kW electron beam gun with a high scanning frequency and hollow-cathode plasma activation with substrate bias to densify the coating. The nominal composition of the substrate was 15 wt. % Cr, about 18.5 wt. % Co, about 5 wt. % Mo, about 3 wt. % Al, about 3.6 wt. % Ti, about 2 wt. % Ta, about 0.5 wt. % Hf, about 0.06 wt. % Zr, about 0.027 wt. % C, about 0.015 wt. % B, and a balance Ni. The nominal composition of the protective layer was 30 wt. % Cr, 30 wt. % Fe, 1 wt. % Mn, 1 wt. % Si, and a balance Ni.

The samples were exposed to a temperature of 800° C. for 300 hours in an air atmosphere. A single-phase $Cr_2O_3$ oxide scale formed on the surface of the protective layer. The average composition of the protective layer was determined using scanning electron microscopy (SEM) with energy dispersive x-ray spectrometry (EDS) after the high temperature exposure, and the protective layer included about 10.6 wt. % Co, which had diffused from the substrate.

Example 1

Figure 2:
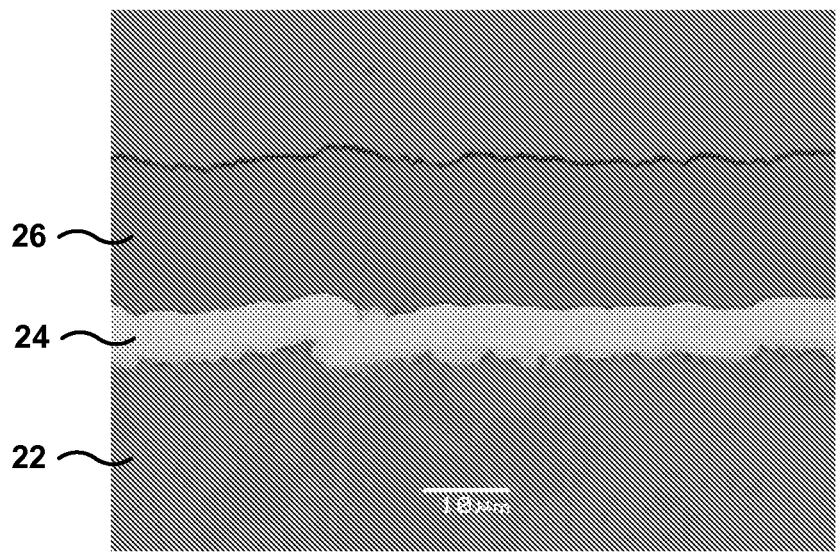
FIG. 2 is a cross-sectional micrograph of an example article that includes a substrate, a diffusion barrier layer formed on the substrate, and a protective layer formed on the diffusion barrier layer.

A set of alloy substrates were each coated with a 10 μm thick diffusion barrier layer consisting of Ir. DVD was used to apply a diffusion barrier layer that was dense and substantially uniform in microstructure. The DVD process utilized a 70 kV and 10 kW electron beam gun with a high scanning frequency and hollow-cathode plasma activation with substrate bias to densify the coating. DVD was also used to deposit a protective layer having a thickness of about 25 μm on the diffusion barrier layer. The nominal composition of the substrate was 15 wt. % Cr, about 18.5 wt. % Co, about 5 wt. % Mo, about 3 wt. % Al, about 3.6 wt. % Ti, about 2 wt. % Ta, about 0.5 wt. % Hf, about 0.06 wt. % Zr, about 0.027 wt. % C, about 0.015 wt. % B, and a balance Ni. The nominal composition of the protective layer was 30 wt. % Cr, 30 wt. % Fe, 1 wt. % Mn, 1 wt. % Si, and a balance Ni. FIG. 2 is a cross-sectional micrograph of an example of the set of alloy substrates that illustrates substrate 22, diffusion barrier layer 24 formed on substrate 22, and protective layer 26 formed on diffusion barrier layer 24.

Figure 3:
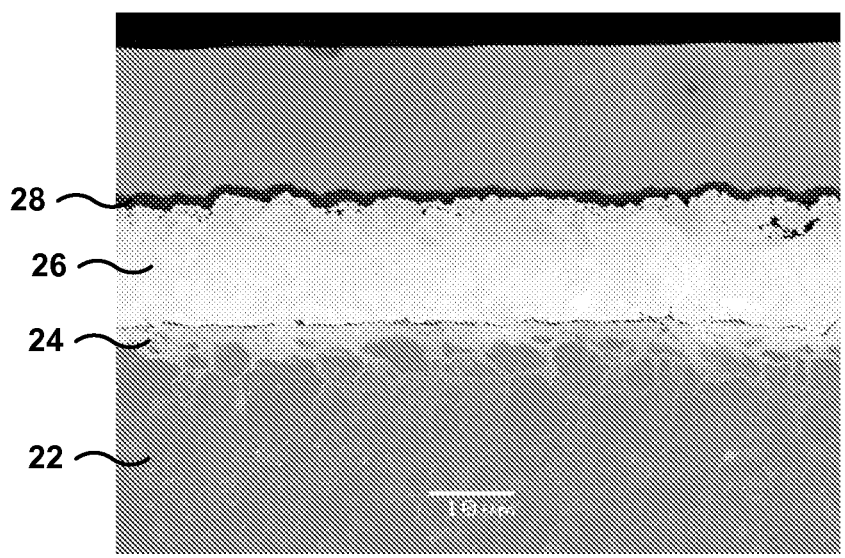
FIG. 3 is a cross-sectional micrograph of an example article that includes a substrate, a diffusion barrier layer formed on the substrate, a protective layer formed on the diffusion barrier layer, and an oxide scale formed on the diffusion barrier layer.

The samples were exposed to a temperature of 800° C. for 300 hours in an air atmosphere. FIG. 3 is a cross-sectional micrograph of an example of the set of alloy substrates that illustrates oxide scale 28 formed on protective layer 26. Additionally, FIG. 3 shows that Ir from diffusion barrier layer 24 diffused into substrate 22 and protective layer 26. The average composition of protective layer 26 was determined using SEM with EDS after the high temperature exposure, and the protective layer 26 included about 3.7 wt. % Co, which had diffused from substrate 22. This is lower than the average amount of Co in the protective layer 26 in the absence of diffusion barrier layer 24.

Example 2

Type II hot corrosion testing was performed on coated substrates that had previously received a pre-oxidation step of 100 hours exposure at 800° C. The nominal composition of the substrate was 15 wt. % Cr, about 18.5 wt. % Co, about 5 wt. % Mo, about 3 wt. % Al, about 3.6 wt. % Ti, about 2 wt. % Ta, about 0.5 wt. % Hf, about 0.06 wt. % Zr, about 0.027 wt. % C, about 0.015 wt. % B, and a balance Ni. The nominal composition of the protective layer was 30 wt. % Cr, 30 wt. % Fe, 1 wt. % Mn, 1 wt. % Si, and a balance Ni. The diffusion barrier layer consisted of Ir and was about 10 μm upon deposition. Test specimens were held at 700° C. in flowing air containing 300 ppm $SO_2$ for 20 hour intervals, between which a salt solution of 0.075 mg/cm² concentration was applied at room temperature to the coated faces. After 100 total hours of exposure at 700° C., the coatings showed no evidence of hot corrosion attack in Type II conditions. The dense and adherent $Cr_2O_3$ scale provided a sufficient barrier against environmental degradation throughout the period tested. The coating with the Ir barrier is expected to retain its resistance to corrosion for a longer duration than a coating without an Ir barrier, because cobalt migration into the protective coating is slowed or reduced.

Various examples have been described. These and other examples are within the scope of the following claims.

The invention claimed is:

1. An article comprising:
   a nickel-based superalloy substrate including between about 2 wt. % and about 5 wt. % aluminum and between about 2 wt. % and about 5 wt. % titanium, wherein the nickel-based superalloy substrate comprises between 40 volume percent and 55 volume percent gamma-prime precipitate phase;
   a diffusion barrier layer on the substrate, wherein the diffusion barrier layer comprises an alloy comprising iridium and silicon, and wherein the alloy comprises a majority iridium; and
   a nickel-based protective layer comprising nickel and at least one of aluminum or chromium on the diffusion barrier layer.

2. The article of claim 1, further comprising an oxide scale formed on the protective layer, wherein the oxide scale comprises an oxide of the at least one of aluminum or chromium.

3. The article of claim 1, wherein the alloy of the diffusion barrier layer further comprises chromium, wherein the alloy comprises less than 1 weight percent (wt. %) silicon.

4. The article of claim 1, wherein the alloy of the diffusion barrier layer further comprises at least one of platinum, palladium, rhenium, ruthenium, or rhodium.

5. The article of claim 1, wherein a thickness of the diffusion barrier layer and the protective layer, measured in a direction substantially normal to a surface of the substrate on which the diffusion barrier layer and the protective layer are formed, is between about 6.35 µm and about 127 µm.

6. The article of claim 5, wherein a thickness of the diffusion barrier layer is between about 5 percent and about 50 percent of the thickness of the diffusion barrier layer and the protective layer.

7. The article of claim 1, wherein the diffusion barrier layer as deposited is essentially free of Ti and Co.

8. The article of claim 1, wherein the alloy of the diffusion barrier layer comprises less than about 1 weight percent (wt. %) of the silicon and greater than 50 wt. % iridium.

9. A method comprising:
forming a diffusion barrier layer on a nickel-based superalloy substrate, wherein the diffusion barrier layer comprises an alloy comprising iridium and silicon, wherein the alloy comprises a majority iridium, wherein the nickel-based superalloy substrate includes between about 2 wt. % and about 5 wt. % aluminum and between about 2 wt. % and about 5 wt. % titanium, and wherein the nickel-based superalloy substrate comprises between about 40 volume percent and about 55 volume percent gamma-prime precipitate phase; and
forming a nickel-based protective layer comprising nickel and at least one of aluminum or chromium on the diffusion barrier layer.

10. The method of claim 9, further comprising forming an oxide scale on the protective layer, wherein the oxide scale comprises at least one of alumina or chromia.

11. The method of claim 9, wherein the alloy of the diffusion barrier layer further comprises chromium, wherein the alloy comprises less than 1 weight percent (wt. %) silicon.

12. The method of claim 9, wherein the alloy of the diffusion barrier layer further comprises at least one of Pt, Pd, Re, Ru, or Rh on the substrate.

13. The method of claim 9, wherein a thickness of the diffusion barrier layer and the protective layer, measured in a direction substantially normal to a surface of the substrate on which the diffusion barrier layer and the protective layer are formed, is between about 6.35 µm inch and about 127 µm.

14. The method of claim 9, wherein forming the diffusion barrier layer on the substrate comprises forming a diffusion barrier layer essentially free of Ti and Co.

15. The method of claim 9, wherein forming the diffusion barrier layer on the substrate comprises forming the diffusion barrier layer on the substrate using at least one of directed vapor deposition, electroplating, or nano-electroplating.

16. An article comprising:
a nickel-based superalloy substrate including between about 2 wt. % and about 5 wt. % aluminum and between about 2 wt. % and about 5 wt. % titanium, wherein the nickel-based superalloy substrate comprises between 40 volume percent and 55 volume percent gamma-prime precipitate phase;
a diffusion barrier layer on the substrate, wherein the diffusion barrier layer comprises an alloy comprising iridium and silicon, and wherein the alloy comprises a predominance of iridium; and
a nickel-based protective layer comprising nickel and at least one of aluminum or chromium on the diffusion barrier layer.

17. The article of claim 16, wherein the alloy of the diffusion barrier layer comprises less than about 1 weight percent (wt. %) of the silicon and between about 10 wt. and about 40 wt. % iridium.

18. The article of claim 17, wherein the alloy of the diffusion barrier layer comprises between about 26 wt. % and about 65 wt. % Ni, between about 15 wt. % and about 30 wt. % Fe, between about 10 wt. % and about 30 wt. % Cr, less than about 1 wt. % Mn, less than about 2 wt. % Al.

19. The article of claim 18, wherein the diffusion barrier layer as deposited is essentially free of Ti and Co.

\* \* \* \* \*

UNITED STATES PATENT AND TRADEMARK OFFICE
CERTIFICATE OF CORRECTION

PATENT NO. : 9,719,353 B2  Page 1 of 1
APPLICATION NO. : 14/111417
DATED : August 1, 2017
INVENTOR(S) : Bolcavage et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 74 days.

Signed and Sealed this
Twenty-fifth Day of September, 2018

Andrei Iancu
*Director of the United States Patent and Trademark Office*